(12) United States Patent
Brockmeier et al.

(10) Patent No.: US 12,415,719 B2
(45) Date of Patent: Sep. 16, 2025

(54) MEMS SENSOR WITH PARTICLE FILTER AND METHOD FOR PRODUCING IT

(71) Applicant: Infineon Technologies AG, Neubiberg (DE)

(72) Inventors: Andre Brockmeier, Villach (AT); Barbara Angela Glanzer, Klagenfurt (AT); Marten Oldsen, Anzing (DE); Francesco Solazzi, Villach (AT); Carsten Von Koblinski, Villach (AT)

(73) Assignee: Infineon Technologies AG, Neubiberg (DE)

( * ) Notice: Subject to any disclaimer, the term of this patent is extended or adjusted under 35 U.S.C. 154(b) by 887 days.

(21) Appl. No.: 17/376,539

(22) Filed: Jul. 15, 2021

(65) Prior Publication Data
US 2022/0033249 A1 Feb. 3, 2022

(30) Foreign Application Priority Data

Aug. 3, 2020 (DE) .......................... 102020120370.5

(51) Int. Cl.
*B81B 7/00* (2006.01)
*B81B 3/00* (2006.01)
(Continued)

(52) U.S. Cl.
CPC .......... *B81B 7/0032* (2013.01); *B81B 3/0021* (2013.01); *B81B 7/0041* (2013.01); *B81B 7/0058* (2013.01); *B81B 7/0061* (2013.01); *B81B 7/007* (2013.01); *B81B 7/0074* (2013.01); *B81B 7/02* (2013.01); *B81C 1/00293* (2013.01); *B81C 1/00357* (2013.01); *G01L 9/0042* (2013.01); *G01L 19/0636* (2013.01); *G01L 19/0654* (2013.01); *H04R 1/04* (2013.01); *B81B 2201/0257* (2013.01);
(Continued)

(58) Field of Classification Search
CPC ............... G01L 9/0042; G01L 19/0636; G01L 19/0654; B81B 7/0035; B81B 7/0041; B81B 7/0058; B81B 7/0061; B81B 7/007; B81B 7/0074; B81B 7/02; B81B 2201/0264; B81C 1/00293
See application file for complete search history.

(56) References Cited

U.S. PATENT DOCUMENTS 9,212,054 B1 * 12/2015 Kwa ................... B81C 1/00674
9,610,543 B2 * 4/2017 Grille ................. B01D 67/0034
(Continued)

FOREIGN PATENT DOCUMENTS

DE 102007029722 A1 1/2009
DE 102015200629 A1 8/2015
(Continued)

*Primary Examiner* — Marcos D. Pizarro
(74) *Attorney, Agent, or Firm* — Harrity & Harrity, LLP

(57) ABSTRACT

The semiconductor device includes a microelectromechanical system (MEMS) chip having a first main surface and a second main surface situated opposite the first main surface, a first glass-based substrate, on which the MEMS chip is arranged by its first main surface, and a second substrate, which is arranged on the second main surface of the MEMS chip, wherein the MEMS chip has a first recess connected to the surroundings by way of a plurality of perforation holes arranged in the first substrate.

19 Claims, 6 Drawing Sheets

(51) Int. Cl.
　　　*B81B 7/02*　　　(2006.01)
　　　*B81C 1/00*　　　(2006.01)
　　　*G01L 9/00*　　　(2006.01)
　　　*G01L 19/06*　　　(2006.01)
　　　*H04R 1/04*　　　(2006.01)

(52) U.S. Cl.
　　　CPC ............... *B81B 2201/0264* (2013.01); *B81C 2201/0133* (2013.01); *H04R 2201/003* (2013.01)

(56) References Cited

U.S. PATENT DOCUMENTS

| | | |
|---|---|---|
| 9,952,110 B2 | 4/2018 | Beer et al. |
| 2014/0037120 A1* | 2/2014 | Lim .................. H04R 1/04 381/355 |
| 2015/0118780 A1 | 4/2015 | Tsai et al. |
| 2017/0250118 A1* | 8/2017 | Yotsuya ............. G01L 9/0054 |
| 2017/0256422 A1 | 9/2017 | Ambrosius et al. |
| 2020/0386645 A1* | 12/2020 | Pfeiffer ............. G01L 19/0618 |

FOREIGN PATENT DOCUMENTS

| | | |
|---|---|---|
| DE | 102014113339 A1 | 3/2016 |
| EP | 1691570 A2 | 8/2006 |

* cited by examiner

MEMS SENSOR WITH PARTICLE FILTER AND METHOD FOR PRODUCING IT

FIELD

The present disclosure relates to a semiconductor device containing a microelectromechanical system (MEMS) chip, and to a method for producing such a semiconductor device.

BACKGROUND

Pressure sensors are often constructed on the basis of microelectromechanical system (MEMS) semiconductor chips in which the actual sensor consists of a thin silicon membrane. This type of pressure sensors usually requires an open access to the sensitive membrane, which detects pressure differences and converts them into electrical signals. This access also makes possible undesired contamination of the sensor by external, environment-specific variables such as particles (sand), gases (exhaust gases, soot), liquids (water, oil), etc., which can extremely impair the reliability and robustness of the sensors.

The contamination and pollution of modern MEMS sensors, in particular pressure sensors (tire pressure and acceleration sensors or microphones) can result not only in undesired drifts in the output signal during the function of the sensors, but also, in the worst case, in destruction of the sensitive membrane. By way of example, the functionality of capacitive microphones can be impaired by particles such as sand and moisture (so-called membrane sticking). In the case of pressure and acceleration sensors mounted directly on the tires rather than on the wheel rim, the centrifugal force additionally results in a considerable accumulation of contaminations in the region of the access opening and thus in an offset of the pressure signal.

For these and other reasons there is a need for the present disclosure.

SUMMARY

Various aspects relate to a semiconductor device, including a microelectromechanical system (MEMS) chip having a first main surface and a second main surface situated opposite the first main surface, a first glass-based substrate, on which the MEMS chip is arranged by its first main surface, and a second substrate, which is arranged on the second main surface of the MEMS chip, wherein the MEMS chip has a first recess connected to the surroundings by way of a plurality of perforation holes arranged in the first substrate.

Various aspects relate to a method for producing a semiconductor device, wherein the method includes providing a microelectromechanical system (MEMS) chip having a first main surface and a second main surface situated opposite the first main surface, wherein the MEMS chip has a recess in its first main surface, providing a first glass-based substrate, wherein the first substrate has a plurality of perforation holes, applying the MEMS chip by its first main surface on the first substrate in such a way that the recess becomes located over the perforation holes, providing a second substrate, which is arranged on the second main surface of the MEMS chip, and applying the second substrate to the second main surface of the MEMS chip.

BRIEF DESCRIPTION OF THE DRAWINGS

Devices and methods in accordance with the disclosure are explained in greater detail below with reference to drawings. The elements shown in the drawings are not necessarily reproduced in a manner true to scale relative to one another. Identical reference signs may designate identical components.

The elements of the drawings are not necessarily true to scale relative to one another. Identical reference numerals designate corresponding identical or similar parts.

DETAILED DESCRIPTION

In the following detailed description, reference is made to the accompanying drawings, which form part of this description and show for illustration purposes specific embodiments in which the disclosure can be practiced. In this case, direction-indicating terminology such as "at the top", "at the bottom", "at the front", "at the back", "leading", "trailing", etc. is used with respect to the orientation of the figure(s) described. Since the constituents of embodiments can be positioned in different orientations, the direction designation is used for illustration and is not restrictive in any way. It goes without saying that other embodiments can also be used, and structural or logical changes can be made, without the scope of the present disclosure being exceeded. Therefore, the following detailed description should not be understood to be restrictive, and the scope of the present disclosure is defined by the appended claims.

It goes without saying that the features of the various exemplary embodiments described here can be combined with one another, unless expressly indicated otherwise.

As used in this specification, the terms "adhesively bonded", "secured", "connected", "coupled" and/or "electrically connected/electrically coupled" do not mean that the elements or layers must be directly contacted with one another; intermediate elements or layers can be provided between the "adhesively bonded", "secured", "connected", "coupled" and/or "electrically connected/electrically coupled" elements. In accordance with the disclosure, however, the terms mentioned above may optionally also have the specific meaning that the elements or layers are directly contacted with one another, that is to say that no intermediate elements or layers are provided between the "adhesively bonded", "secured", "connected", "coupled" and/or "electrically connected/electrically coupled" elements.

Furthermore, the word "over" used with regard to a part, an element or a material layer that is formed or arranged "over" a surface may mean herein that the part, the element or the material layer is arranged (e.g. positioned, formed, deposited, etc.) "indirectly" on the implied surface, wherein one or more additional parts, elements or layers are arranged between the implied surface and the part, the element or the material layer. However, the word "over" used with regard to a part, an element or a material layer that is formed or arranged "over" a surface may optionally also have the specific meaning that the part, the element or the material layer is arranged (e.g. positioned, shaped, deposited, etc.) "directly on", e.g. in direct contact with, the implied surface.

Figure 1:
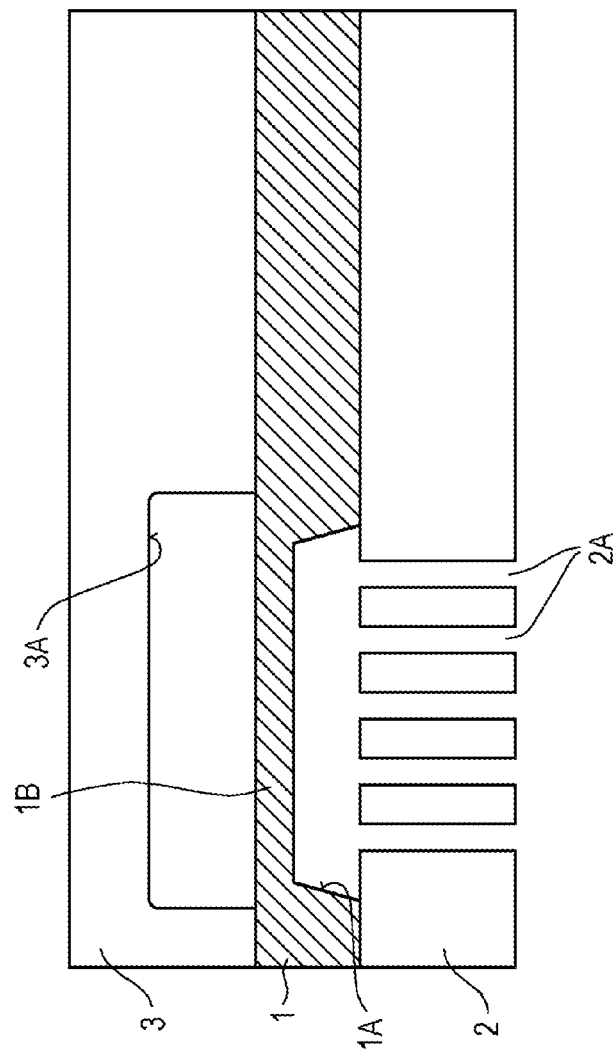
FIG. 1 shows a schematic lateral cross-sectional view of an exemplary semiconductor device in the form of a MEMS pressure sensor, in which the first substrate has a constantly uniform thickness.

FIG. 1 shows a schematic lateral cross-sectional view of an exemplary semiconductor device.

The semiconductor device 10 in accordance with FIG. 1 comprises a microelectromechanical system (MEMS) chip 1 having a first main surface and a second main surface situated opposite the first main surface, a first glass-based substrate 2, in particular based on silicate glass such as e.g. borosilicate glass, soda-lime glass, float glass, quartz glass, or porcelain, on which substrate 2 the MEMS chip 1 is arranged by its first main surface, and a second substrate 3, which is arranged on the second main surface of the MEMS chip 1, wherein the MEMS chip 1 has a first recess 1A connected to the surroundings by way of a plurality of perforation holes 2A arranged in the first substrate 2. The perforation holes have the function of a filter for protecting the sensor against contamination, in particular with particles from the surroundings.

The sensor can be one or more from the group containing a pressure sensor, a sound sensor, a microphone, a gas sensor or a combined pressure/acceleration sensor.

In the case of a pressure sensor, a sound sensor or a microphone, the MEMS chip 1 has a membrane 1B, wherein the recess 1A extends as far as the membrane 1B. The MEMS chip 1 can be a semiconductor chip, in particular an Si chip, wherein the membrane is formed from silicon in this case.

The second substrate 3 can likewise be produced on the basis of glass. As an alternative thereto, it can also be produced on the basis of a semiconductor, in particular silicon. A plastic is also conceivable as a material basis for the second substrate 3.

A diameter of the perforation holes 2A can be in a range of 3 µm to 50 µm. The perforation holes 2A can be arranged regularly, in particular in a matrix-shaped fashion or point-symmetrically around a center point. Exemplary embodiments in respect thereof will also be shown further below.

The first substrate 2 can have a thickness in a range of 50 µm to 550 µm. With the abovementioned range for the diameter of the perforation holes, a range for the aspect ratio of from 1:1 to 1:110 thus results.

The configuration of the filter structure will depend very greatly on the type of sensor in the practical application. Since microphones, for example, react particularly sensitively to particles, in the case of these the size of the perforation holes can be in a range of 3 µm to 10 µm. By contrast, in the case of pressure sensors, the perforation holes can also turn out to be larger, for example 10 µm to 30 µm. With regard to the substrate thickness of the particle filter, this thickness can be in the range of 50 µm to 100 µm in the case of microphones, while it can be in the range of 300 µm to 600 µm in the case of pressure sensors.

The size of the perforation area in comparison with the membrane area can encompass a wide range of from significantly less than 50% to significantly more than 50%. In the case of microphones, in particular, it can be 50% or more.

In the case of the semiconductor device 10 shown in FIG. 1, the first substrate 2 has a spatially constant thickness, such that the perforation holes have to be produced through a substrate that, under certain circumstances, is very thick. However, there is also the possibility of the first substrate 2 having a smaller thickness in a region of the perforation holes than outside the perforation holes. Exemplary embodiments in respect thereof will also be shown further below.

In the case of a pressure or sound sensor or a microphone, the second substrate 3 of the MEMS chip 1 has a second recess 3A, which is situated opposite the first recess 1A of the MEMS chip 1 and forms a back volume for the sensor or the microphone.

With regard to the electrical contacting, the first substrate can have electrical through connections which are connected to the MEMS chip and extend as far as a main surface facing away from the MEMS chip. An exemplary embodiment in respect thereof will also be shown further below.

It has been found, moreover, that the presence of water in the perforation holes can result in falsifications of the measurement results. Therefore, provision can be made for a hydrophobic layer to be applied to the walls of the perforation holes 2A and the surrounding or adjacent areas, or for the surfaces around the perforation holes 2A to be microstructured, such that water cannot adhere there owing to its surface tension.

Figure 2:
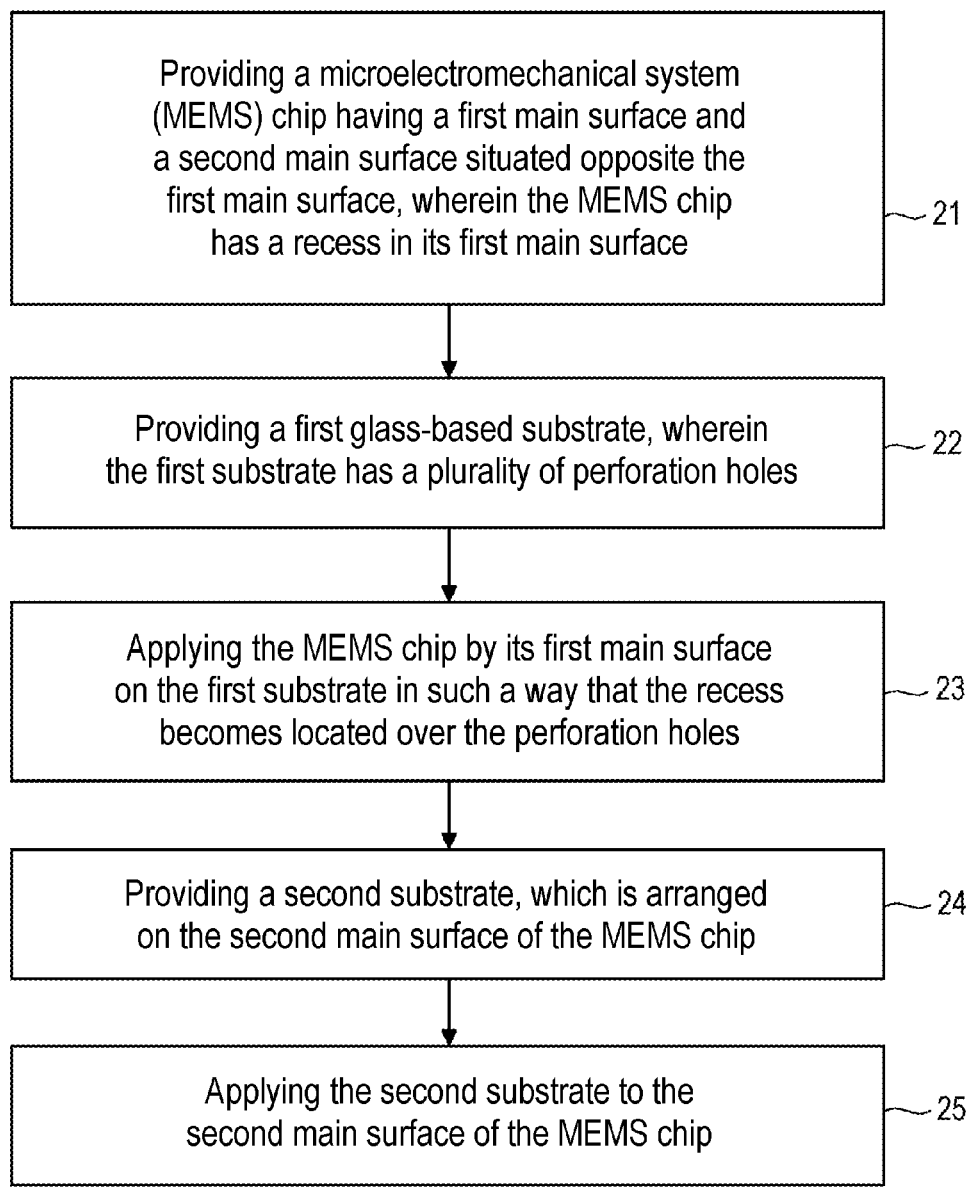
FIG. 2 shows a flow diagram of a method for producing a semiconductor device.

FIG. 2 shows a flow diagram for illustrating a method for producing a semiconductor device.

The method 20 in accordance with FIG. 2 comprises providing a microelectromechanical system (MEMS) chip having a first main surface and a second main surface situated opposite the first main surface, wherein the MEMS chip has a recess in its first main surface (21), providing a first glass-based substrate, wherein the first substrate has a plurality of perforation holes (22), applying the MEMS chip by its first main surface on the first substrate in such a way that the recess becomes located over the perforation holes (23), providing a second substrate, which is arranged on the second main surface of the MEMS chip (24), and applying the second substrate to the second main surface of the MEMS chip (25).

In accordance with one embodiment of the method 200, the perforation holes will be implemented in the first substrate by application of the LIDE method (Laser Induced Deep Etching) from LPKF, this method being known per se and described in greater detail in the document DE 10 2014 113 339 A1. In particular, in this method, the regions to be removed of the later perforation holes are modified by a pulsed laser beam and are subsequently removed by etching, for example wet-chemical etching. The pulsed laser radiation (pulse length <50 ps, preferably <10 ps, wavelength for example in the visible spectral range, repetition rate in the MHz range) is focused onto a focal point within the glass substrate. Depending on the thickness of the glass substrate, provision can be made for the focal point to be guided through the glass substrate by altering the position of the focusing lens. The glass substrate is transparent to the laser beam, such that it is possible to penetrate through the glass substrate over the entire thickness thereof. On account of nonlinear-optical effects (self-focusing on account of the Kerr effect and defocusing as a result of diffraction), the laser pulses change the optical and chemical properties of the material in such a way that the latter becomes selectively etchable. In a subsequent etching process, the material modified in this way decomposes significantly more rapidly than the unmodified glass.

In the case of wet-chemical etching, an HF solution of low concentration can be used. The concentration can be in a range of 5 wt. % to 30 wt. %, for example, and can be in particular approximately 10 wt. %.

It can be provided that before producing the perforation holes, a region of the first substrate around the perforation holes is thinned. The laser beam then only has to damage the glass material along the thinned glass substrate. In this case, the procedure can also be implemented such that firstly the glass material is damaged only to a specific substrate depth by means of the laser beam and subsequently the non-damaged part and thus also the damaged portions are removed by wet-chemical etching.

As has already been noted above, a hydrophobic layer can be applied to the walls of the perforation holes and the surrounding or adjacent areas, or the surfaces around the perforation holes can be microstructured.

Provision can furthermore be made for electrical through connections to be produced in the first substrate in such a way that they are connected to the MEMS chip and extend as far as a main surface facing away from the MEMS chip. An exemplary embodiment in respect thereof is described in greater detail further below.

Furthermore, the MEMS chip together with the first substrate and/or the second substrate can be connected to one another by anodic or plasma-activated bonding, eutectic bonding, bonding using glass frit or glass pastes, thermocompression bonding, adhesive bonding. Innovative mechanical bonding methods with the aid of lasers are also conceivable. It is possible, for example, also for Si substrates carried reversibly on one side to be bonded to a glass substrate irreversibly and without increased thermal loading of the reversible carrier.

It is furthermore possible and expedient to produce a plurality of semiconductor devices at the wafer level.

Figure 3A:
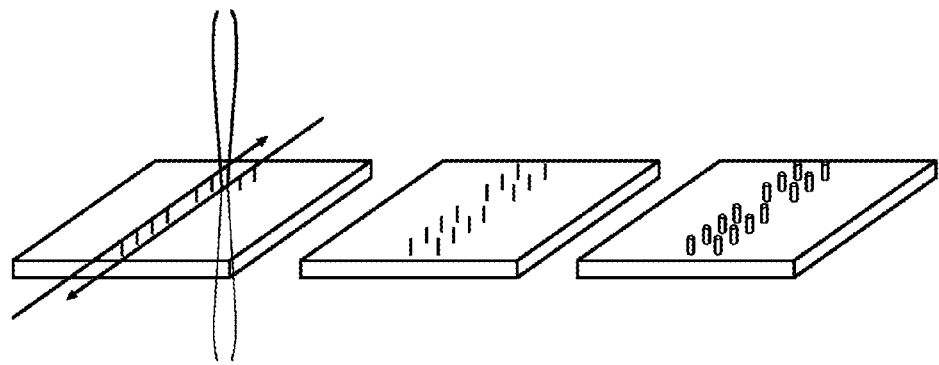
FIGS. 3A and 3B show perspective views for illustrating the LIDE method for producing the perforation holes (FIG. 3A) and for producing microcuts (FIG. 3B).
Figure 3B:
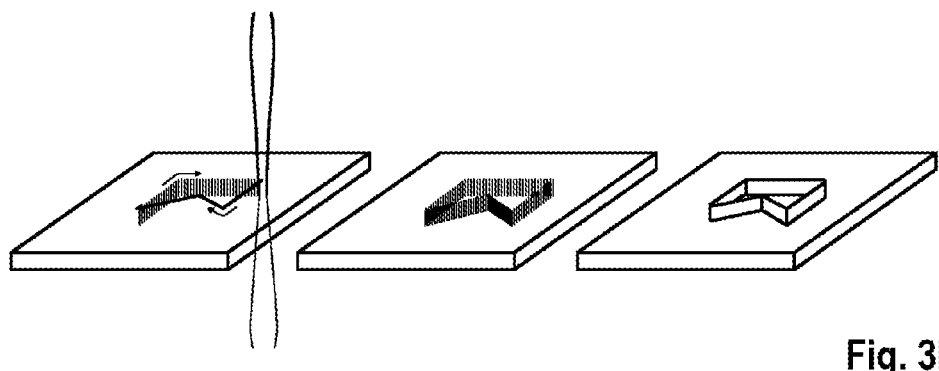

FIGS. 3A and 3B show perspective views for illustrating the LIDE method for producing the perforation holes (FIG. 3A) and for producing microcuts (FIG. 3B).

FIG. 3A shows, in the left-hand part of the figure, a substrate composed of (silicate) glass having a thickness of approximately 400 μm, for example, into which perforation holes are intended to be shaped. A pulsed laser beam is scanned along a line over the surface of the substrate. The scanning speed can be coordinated with the repetition rate of the laser pulses in such a way that an individual laser pulse can in each case effect damage to the material at a desired location of a perforation hole to be produced. The succeeding laser pulse then impinges on the glass substrate at a desired distance from the impingement point of the previous laser pulse, etc. Two lines of the scanning movement of the laser beam are depicted in FIG. 3A. Having arrived at an end of the substrate, the laser beam is offset laterally and then scanned over the substrate in the opposite direction, with the result that two rows of damaged regions for envisaged perforation holes are obtained.

FIG. 3A shows, in the middle part of the figure, the situation after the action of the laser pulses and after the end of the scanning process.

FIG. 3A shows, in the right-hand part of the figure, the situation after carrying out the wet-chemical etching, according to which the regions of the glass substrate that had been modified by the laser beam were removed and the perforation holes were thus produced.

FIG. 3B shows, in the left-hand part of the figure, a substrate composed of (silicate) glass having a thickness of approximately 400 μm, for example, into which microcuts are intended to be produced. A pulsed laser beam is scanned along a line over the surface of the substrate, wherein the line is intended to form the boundary of a portion of the glass substrate that is to be cut out. This time the scanning speed is coordinated with the repetition rate of the laser pulses in such a way that an individual laser pulse can in each case effect damage to the material at a desired location of a perforation hole to be produced. However, the succeeding laser pulse then impinges on the glass substrate at an impingement point along the predefined line that is directly adjacent to the impingement point of the previous laser pulse, a spatial overlap of the two adjacent impingement points being set. A continuous region of the glass substrate along the predefined line is damaged as a result.

FIG. 3B shows, in the middle part of the figure, the situation after the action of the laser pulses and after the end of the scanning process.

FIG. 3B shows, in the right-hand part of the figure, the situation after carrying out the wet-chemical etching, according to which not only the continuous region of the glass substrate along the line but also the region of the glass substrate enclosed by the line were removed.

Figure 4:
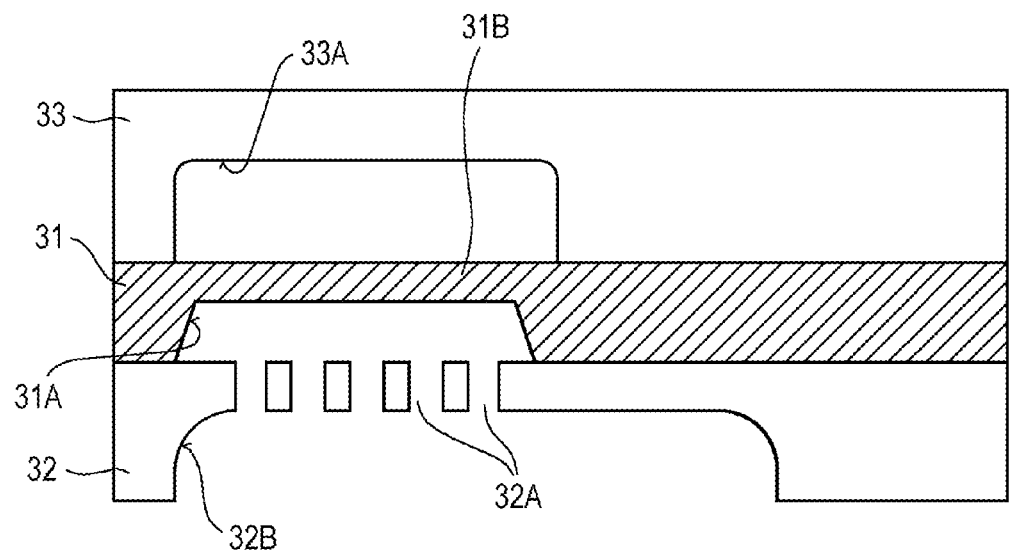
FIG. 4 shows a schematic lateral cross-sectional view of an exemplary semiconductor device in which the first substrate has a recess produced by wet-chemical etching.

FIG. 4 shows a schematic lateral cross-sectional view of an exemplary semiconductor device.

The semiconductor device 30 in accordance with FIG. 4 comprises a microelectromechanical system (MEMS) chip 31 having a first main surface and a second main surface situated opposite the first main surface, a first glass-based substrate 32, on which the MEMS chip 31 is arranged by its first main surface, and a second substrate 33 arranged on the second main surface of the MEMS chip 31, wherein the MEMS chip 31 has a first recess 31A connected to the surroundings by way of a plurality of perforation holes 32A arranged in the first substrate 32. The MEMS chip 31 can have a membrane 31B, as far as which the recess 31A extends. The second substrate 33 can likewise have a recess 33A.

In contrast to the semiconductor device 10 in FIG. 1, in the case of the semiconductor device 30 the first substrate 32 is thinned in a region around the perforation holes 32A. The first substrate 32 thus has a recess 32B on its rear side, which recess can be produced by isotropic wet-chemical etching. This may be advantageous with regard to the functioning of the particle filter formed by the perforation holes. The perforation holes only have to be produced over a reduced thickness of the first glass substrate 32.

The semiconductor device 30 can be produced in two different ways.

Firstly, in a first method step, the recess 32B can be produced by an isotropic wet-chemical etching step and, subsequently, the perforation holes 32A can be produced by the LIDE method in the manner as described above.

Secondly, however, it is also possible first to produce the regions of the first substrate 32 that are provided for the perforation holes by means of the laser beam treatment of the LIDE method. In this case, the parameters of the laser beam treatment would be set in such a way that the glass material would be damaged only to a desired depth of the first substrate 32, namely exactly as far as the plane to which the first substrate 32 would then subsequently be thinned from below. The wet-chemical etching is subsequently carried out, during which then not only is the first substrate 32 thinned from below but at the same time directly thereafter the damaged regions above that are likewise removed by the etching step. This method implementation would have the advantage that only a single temporally continuous etching step would have to be carried out.

Figure 5:
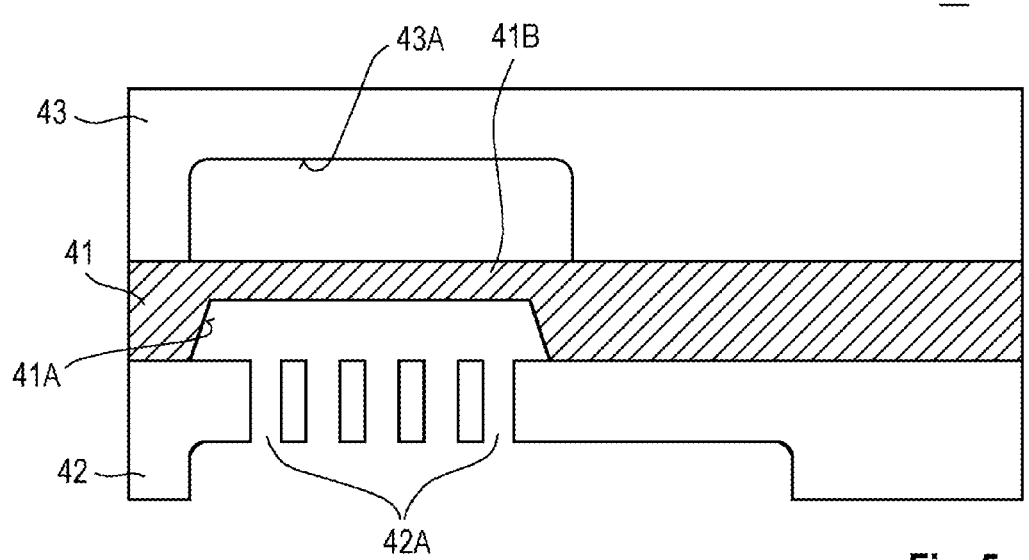
FIG. 5 shows a schematic lateral cross-sectional view of an exemplary semiconductor device in which the first substrate has a recess produced by the LIDE method.

FIG. 5 shows a schematic lateral cross-sectional view of an exemplary semiconductor device.

The semiconductor device 40 in accordance with FIG. 5 comprises a perforation hole (MEMS) chip 41 having a first main surface and a second main surface situated opposite the first main surface, a glass-based substrate 42, on which the MEMS chip 41 is arranged by its first main surface, and a second substrate 43 arranged on the second main surface of the MEMS chip 41, wherein the MEMS chip 41 has a first recess 41A connected to the surroundings by way of a plurality of perforation holes 42A arranged in the first substrate 42. The MEMS chip 41 can have a membrane 41B, as far as which the recess 41A extends. The second substrate 43 can likewise have a recess 43A.

The semiconductor device 40 in FIG. 5, like the semiconductor device 30 in FIG. 4, has a thinned first substrate 42, wherein the first substrate 42 has a recess 42B, but the recess 42B was produced in a different way than the recess 32B. The semiconductor device 40 can be produced in two different ways.

Firstly, in a first method step, the recess 42B can be produced by a LIDE method on the rear side. In this case, the entire region to be removed is scanned by the laser beam by a procedure in which—as was explained in association with FIG. 3B—a pulsed laser beam is scanned along a line over the surface of the substrate, a spatial overlap being set between adjacent impingement points of the laser beam. The laser beam is subsequently scanned along an adjacent line over the surface, a spatial overlap once again being set between the impingement points of the two adjacent lines. In this way, the lines are joined together and the entire region is damaged without any gaps. The entire region is subsequently removed by means of an isotropic wet-chemical etching step. As can be seen in FIG. 5, a well region having perpendicular side walls is thus produced. Then—as explained with regard to FIG. 4—the perforation holes are produced from the other side by means of the LIDE method.

Secondly, however, it is also possible first to produce the regions of the first substrate 42 that are provided for the perforation holes by means of the laser beam treatment of the LIDE method. In this case, the parameters of the laser beam treatment would be set in such a way that the glass material would be damaged only to a desired depth of the first substrate 42, namely exactly as far as the plane to which the first substrate 42 would then subsequently be thinned from below. The wet-chemical etching is subsequently carried out, during which then not only is the first substrate 42 thinned from below but at the same time directly thereafter the damaged regions above that are likewise removed by the etching step. This method implementation would have the advantage that only a single temporally continuous etching step would have to be carried out.

Figure 6:
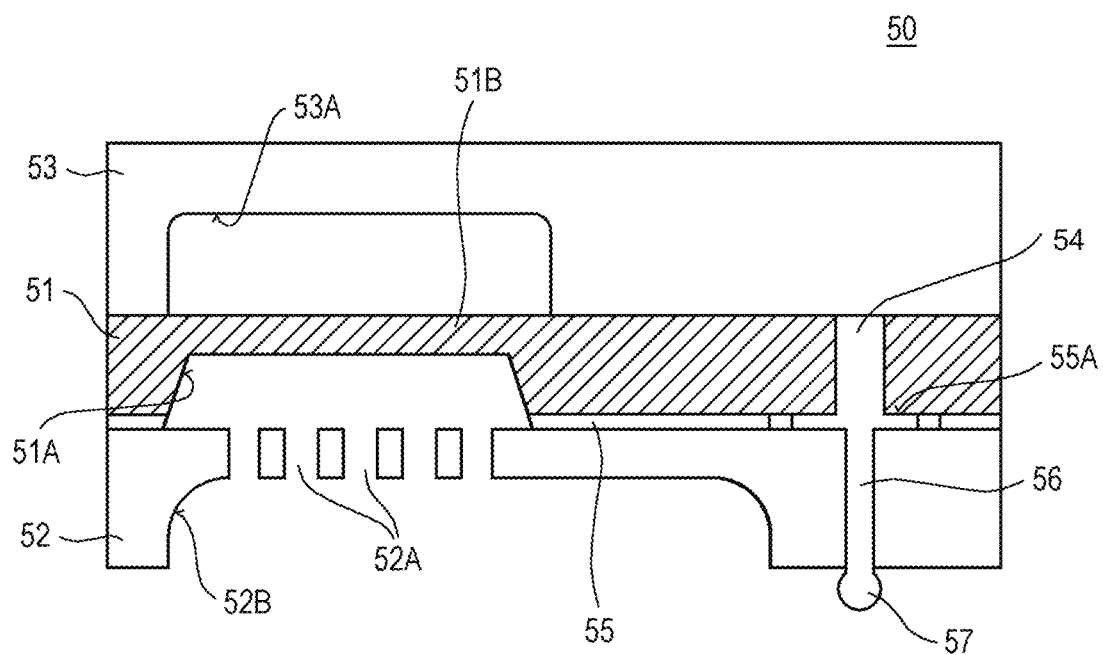
FIG. 6 shows a schematic lateral cross-sectional view of an exemplary semiconductor device in which the first substrate has electrical through connections which are connected to the MEMS chip and extend as far as a main surface facing away from the MEMS chip.

FIG. 6 shows a schematic lateral cross-sectional view of an exemplary semiconductor device.

The semiconductor device 50 in accordance with FIG. 6 comprises a microelectromechanical system (MEMS) chip 51 having a first main surface and a second main surface situated opposite the first main surface, a first glass-based substrate 52, on which the MEMS chip 51 is arranged by its first main surface, and a second substrate 53 arranged on the second main surface of the MEMS chip 51, wherein the MEMS chip 51 has a first recess 51A connected to the surroundings by way of a plurality of perforation holes 52A arranged in the first substrate 52. The MEMS chip 51 can additionally have a membrane 51B, as far as which the first recess 51A extends. The second substrate 53 can likewise have a recess 53A.

In the same way as in the case of the semiconductor device 30, in the case of the semiconductor device 50, too, the first substrate 52 is thinned in a region around the perforation holes 52A. The first substrate 52 thus has a recess 52B on its rear side, which recess can be produced by isotropic wet-chemical etching.

FIG. 6 additionally shows how the electrical contacting of the MEMS chip 51 can be embodied. Accordingly, at least one electrical line is formed on the upper surface of the MEMS chip 51, said at least one electrical line being connected to the membrane 51B. The electrical line is led to a location at which a first electrical through connection 54 (TSV, through silicon via) is formed through the Si chip 51. A metallization layer 55 having a contacting region 55A is applied to the lower surface of the MEMS chip 51, the through connection 54 being electrically connected to said contacting region. Proceeding from the contacting region 55A, a second electrical through connection 56 (TGV, through glass via) is formed through the first substrate 52. At its lower end the second electrical through connection 56 is connected to a solder ball 57, which is thus also partly applied on the lower surface of the first substrate 52. The metallization layer 55 can be used to connect the first substrate 52 and the MEMS chip 51 to one another by means of a eutectic bonding process.

Figure 7A:
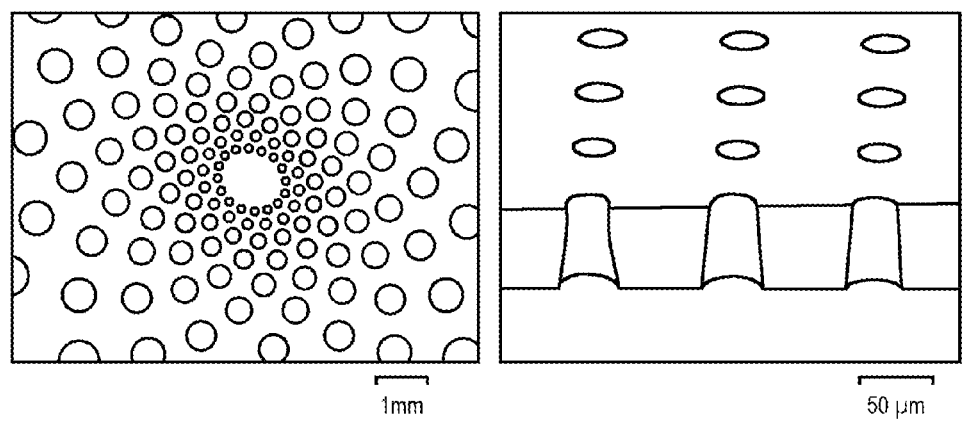
FIGS. 7A and 7B show various arrangements of the perforation holes in electron microscope micrographs (FIG. 7A) and schematic plan views (FIG. 7B).
Figure 7B:
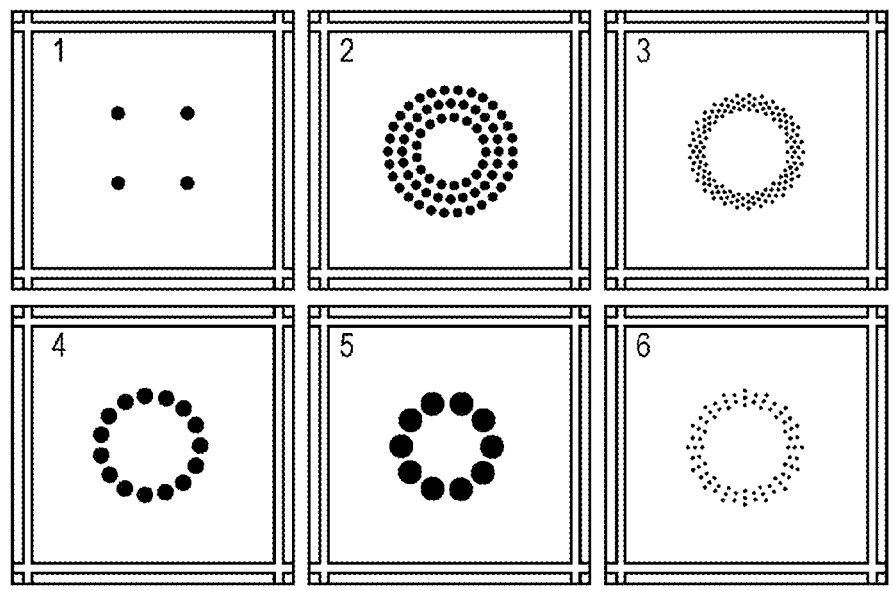

FIGS. 7A and 7B show various arrangements of the perforation holes.

FIG. 7A shows two electron microscope micrographs of two different arrangements. The image on the left shows an arrangement comprising perforation holes of different sizes arranged in the form of concentric circles around a center point. The diameter of the perforation holes increases with increasing radius from the center point. By contrast, the image on the right shows a matrix-shaped arrangement of perforation holes. In the lower part of the image it is additionally evident that the through openings have a slightly conical shape.

FIG. 7B shows six schematic plan views of arrangements of perforation holes. What all these arrangements have in common is that the perforation holes are arranged point-symmetrically around a center point.

EXAMPLES

Devices and methods in accordance with the disclosure are explained below on the basis of examples.

Example 1 is a semiconductor device, comprising a microelectromechanical system (MEMS) chip having a first main surface and a second main surface situated opposite the first main surface, a first glass-based substrate, on which the MEMS chip is arranged by its first main surface, and a second substrate, which is arranged on the second main surface of the MEMS chip, wherein the MEMS chip has a first recess connected to the surroundings by way of a plurality of perforation holes arranged in the first substrate.

Example 2 is a semiconductor device according to example 1, wherein the MEMS chip has a sensor or a microphone arranged in the recess.

Example 3 is a semiconductor device according to example 2, wherein the MEMS chip has a membrane, wherein the recess extends as far as the membrane.

Example 4 is a semiconductor device according to example 2 or 3, wherein the sensor is one or more of a pressure sensor, a sound sensor, a microphone, a gas sensor or a combined pressure/acceleration sensor.

Example 5 is a semiconductor device according to any of the preceding examples, wherein a diameter of the perforation holes is in a range of 3 µm to 50 µm.

Example 6 is a semiconductor device according to any of the preceding examples, wherein the perforation holes are arranged regularly, in particular in a matrix-shaped fashion or point-symmetrically around a center point.

Example 7 is a semiconductor device according to any of the preceding examples, wherein the first substrate has a thickness in a range of 50 µm to 550 µm.

Example 8 is a semiconductor device according to any of the preceding examples, wherein the first substrate has a smaller thickness in a region of the perforation holes than outside the perforation holes.

Example 9 is a semiconductor device according to example 2 and any of examples 3 to 8 referring back to example 2, wherein the second substrate has a second recess, which are situated opposite the first recess of the MEMS chip and forms a back volume for the sensor or the microphone.

Example 10 is a semiconductor device according to any of the preceding examples, wherein the first substrate has electrical through connections which are connected to the MEMS chip and extend as far as a main surface facing away from the MEMS chip.

Example 11 is a semiconductor device according to any of the preceding examples, wherein a hydrophobic layer is applied to the walls of the perforation holes and the surrounding or adjacent areas, or surfaces around the perforation holes are microstructured.

Example 12 is a method for producing a semiconductor device, wherein the method comprises providing a microelectromechanical system (MEMS) chip having a first main surface and a second main surface situated opposite the first main surface, wherein the MEMS chip has a recess in its first main surface, providing a first glass-based substrate, wherein the first substrate has a plurality of perforation holes, applying the MEMS chip by its first main surface on the first substrate in such a way that the recess becomes located over the perforation holes, providing a second substrate, which is arranged on the second main surface of the MEMS chip, and applying the second substrate to the second main surface of the MEMS chip.

Example 13 is a method according to example 12, wherein the perforation holes are produced by exposing the first substrate to a laser beam.

Example 14 is a method according to example 13, wherein the regions to be removed of the later perforation holes are damaged by the laser beam and subsequently removed by wet-chemical etching.

Example 15 is a method according to example 13, wherein the regions to be removed of the later perforation holes are ablated by the laser beam.

Example 16 is a method according to any of examples 13 to 15, wherein before or after producing the perforation holes, a region of the first substrate around the perforation holes is thinned.

Example 17 is a method according to any of the preceding examples, wherein the MEMS chip together with the first substrate and/or the second substrate are connected to one another by anodic or plasma-activated bonding, eutectic bonding, bonding using glass frit or glass pastes, thermocompression bonding, adhesive bonding.

Example 18 is a method according to any of the preceding examples, wherein electrical through connections are produced in the first substrate in such a way that they are connected to the MEMS chip and extend as far as a main surface facing away from the MEMS chip.

Example 19 is a method according to any of the preceding examples, wherein a hydrophobic layer is applied to the walls of the perforation holes and the surrounding or adjacent areas, or surfaces around the perforation holes are microstructured.

Example 20 is a method according to any of the preceding examples, wherein a plurality of semiconductor devices are produced at the wafer level.

Although specific embodiments have been illustrated and described here, those of ordinary skill in the art will appreciate that a large number of alternative and/or equivalent implementations can replace the specific embodiments shown and described, without the scope of the present disclosure being exceeded. This application is intended to cover all adaptations or variations of the specific embodiments discussed here. Therefore, the intention is for this disclosure to be restricted only by the claims and the equivalents thereof.

What is claimed is:

1. A semiconductor device, comprising:
   a microelectromechanical system (MEMS) chip having a first main surface and a second main surface situated opposite the first main surface;
   a first glass-based substrate, on which the first main surface of the MEMS chip is arranged, wherein the first glass-based substrate includes a plurality of perforation holes;
   a second substrate which is arranged on the second main surface of the MEMS chip,
       wherein the first main surface of the MEMS chip has a first recess connected to an external environment by way of the plurality of perforation holes that extend through the first glass-based substrate between the first recess and the external environment,
       wherein the second substrate has a second recess that is situated opposite the first recess of the MEMS chip and forms a back volume for the MEMS chip,
       wherein the MEMS chip has a membrane situated between the first recess and the second recess,
       wherein the first glass-based substrate includes a first through connection that extends through the first glass-based substrate,
       wherein the MEMS chip has a second through connection that extends through the MEMS chip, in alignment with the first through connection; and
   a metallization that extends from the second main surface of the MEMS chip, through the first through connection, and through the second through connection.

2. The semiconductor device as claimed in claim 1, wherein the MEMS chip includes an electrical line arranged on the second main surface of the MEMS chip, and
   wherein the electrical line is connected to the membrane and the metallization.

3. The semiconductor device as claimed in claim 2, further comprising:
   a metallization layer arranged on the first main surface of the MEMS chip, between the first main surface of the MEMS chip and the first glass-based substrate,
       wherein the metallization layer is in contact with the metallization for electrical contact with the metallization.

4. A semiconductor device, comprising:
a microelectromechanical system (MEMS) chip having a first main surface and a second main surface situated opposite the first main surface;
a first glass-based substrate, on which the first main surface of the MEMS chip is arranged, wherein the first glass-based substrate comprises a first portion and a second portion, wherein the second portion is thinner than the first portion and includes a plurality of perforation holes, wherein the first portion and the second portion of the first glass-based substrate have a common planar surface, and wherein the first main surface of the MEMS chip is arranged on the common planar surface of the first portion and the second portion of the first glass-based substrate;
a second substrate which is arranged on the second main surface of the MEMS chip,
wherein the first main surface of the MEMS chip has a first recess connected to an external environment by way of the plurality of perforation holes that extend through the first glass-based substrate between the first recess and the external environment,
wherein the second substrate has a second recess that is situated opposite the first recess of the MEMS chip and forms a back volume for the MEMS chip,
wherein the MEMS chip has a semiconductor membrane situated between the first recess and the second recess,
wherein the first glass-based substrate includes a first through connection that extends through the first glass-based substrate,
wherein the MEMS chip has a second through connection that extends through the MEMS chip, in alignment with the first through connection; and
a metallization that extends from the second main surface of the MEMS chip, through the first through connection, and through the second through connection.

5. The semiconductor device as claimed in claim 4, wherein the MEMS chip has a sensor or a microphone arranged in the first recess, and
wherein the second recess forms a back volume for the sensor or the microphone.

6. The semiconductor device as claimed in claim 4, wherein:
the MEMS chip has a sensor arranged in the first recess, and
the sensor is one or more of a pressure sensor, a sound sensor, a microphone, a gas sensor, or a combined pressure and acceleration sensor.

7. The semiconductor device as claimed in claim 4, wherein:
a diameter of each of the plurality of perforation holes is in a range of 3 µm to 50 µm.

8. The semiconductor device as claimed in claim 4, wherein:
the plurality of perforation holes are arranged in a matrix-shaped fashion.

9. The semiconductor device as claimed in claim 1, wherein:
the first glass-based substrate has a thickness in a range of 50 µm to 550 µm.

10. The semiconductor device as claimed in claim 1, wherein:
the first glass-based substrate has electrical through connections that are electrically connected to the MEMS chip and extend to a main surface of the first glass-based substrate that faces away from the MEMS chip.

11. The semiconductor device as claimed in claim 1,
wherein the semiconductor device further comprises a hydrophobic layer applied to sidewalls of the plurality of perforation holes and to adjacent areas of the first glass-based substrate, or
wherein surfaces of the first glass-based substrate around the plurality of perforation holes are micro-structured.

12. The semiconductor device as claimed in claim 1, wherein semiconductor surfaces of the semiconductor membrane are in direct contact with the first recess and the second recess, respectively, such that the semiconductor membrane is directly exposed to the first recess and the second recess.

13. The semiconductor device as claimed in claim 1, wherein the first glass-based substrate has a third recess that defines the first portion and the second portion, and
wherein the first recess and the third recess are connected by the plurality of perforation holes.

14. The semiconductor device as claimed in claim 1, further comprising:
a conductive structure arranged on a surface of the first glass-based substrate, the surface being arranged opposite to the common planar surface,
wherein the conductive structure is connected to the metallization.

15. The semiconductor device as claimed in claim 1, further comprising:
a metallization layer arranged on the first main surface of the MEMS chip, between the first main surface of the MEMS chip and the first glass-based substrate,
wherein the metallization layer is in contact with the metallization for electrical contact with the metallization.

16. The semiconductor device as claimed in claim 15, wherein the metallization layer has a contacting region that is in direct contact with the first main surface of the MEMS chip.

17. The semiconductor device as claimed in claim 1, wherein the MEMS chip includes an electrical line arranged on the second main surface of the MEMS chip, and
wherein the electrical line is connected to the semiconductor membrane and the metallization.

18. The semiconductor device as claimed in claim 17, further comprising:
a metallization layer arranged on the first main surface of the MEMS chip, between the first main surface of the MEMS chip and the first glass-based substrate,
wherein the metallization layer is in contact with the metallization for electrical contact with the metallization.

19. The semiconductor device as claimed in claim 18, wherein the metallization layer has a contacting region that is in direct contact with the first main surface of the MEMS chip.

* * * * *